US012199176B2

(12) United States Patent
Chang et al.

(10) Patent No.: US 12,199,176 B2
(45) Date of Patent: Jan. 14, 2025

(54) SEMICONDUCTOR DEVICE

(71) Applicant: UNITED MICROELECTRONICS CORP., Hsin-Chu (TW)

(72) Inventors: Chun-Ming Chang, Kaohsiung (TW); Wen-Jung Liao, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/372,716

(22) Filed: Sep. 26, 2023

(65) Prior Publication Data
US 2024/0014311 A1 Jan. 11, 2024

Related U.S. Application Data

(63) Continuation of application No. 18/079,901, filed on Dec. 13, 2022, now Pat. No. 11,810,972, which is a continuation of application No. 17/321,534, filed on May 17, 2021, now Pat. No. 11,557,669, which is a continuation of application No. 16/655,252, filed on Oct. 17, 2019, now Pat. No. 11,043,584.

(30) Foreign Application Priority Data
Sep. 12, 2019 (CN) .......................... 201910862579.5

(51) Int. Cl.
*H01L 29/778* (2006.01)
*H01L 29/06* (2006.01)
*H01L 29/66* (2006.01)

(52) U.S. Cl.
CPC ...... *H01L 29/7786* (2013.01); *H01L 29/0653* (2013.01); *H01L 29/66462* (2013.01); *H01L 29/7787* (2013.01); *H01L 29/778* (2013.01)

(58) Field of Classification Search
CPC ......... H01L 29/66431; H01L 29/66462; H01L 29/778–7789; H01L 2924/123064; H01L 29/0653; H01L 29/0843; H01L 29/7786
See application file for complete search history.

(56) References Cited

U.S. PATENT DOCUMENTS

| | | | |
|---|---|---|---|
| 4,663,643 A | 5/1987 | Mimura | |
| 7,012,287 B2 | 3/2006 | Kobayashi | |
| 8,076,699 B2 | 12/2011 | Chen | |
| 8,242,539 B2 | 8/2012 | Ohmaki | |
| 8,872,232 B2 | 10/2014 | Imada | |
| 9,508,842 B2 * | 11/2016 | Miyake | ............ H01L 29/66462 |
| 9,583,574 B2 | 2/2017 | Dasgupta | |

(Continued)

FOREIGN PATENT DOCUMENTS

| | | |
|---|---|---|
| CN | 103681831 A | 3/2014 |
| CN | 103890923 A | 6/2014 |
| CN | 104603912 A | 5/2015 |

*Primary Examiner* — Jose R Diaz
(74) *Attorney, Agent, or Firm* — Winston Hsu

(57) ABSTRACT

A semiconductor device includes an enhancement mode high electron mobility transistor (HEMT) with an active region and an isolation region. The HEMT includes a substrate, a group III-V body layer, a group III-V barrier layer and a recess. The group III-V body layer is disposed on the substrate. The group III-V barrier layer is disposed on the group III-V body layer in the active region and the isolation region. The recess is disposed in the group III-V barrier layer without penetrating the group III-V barrier layer in the active region.

12 Claims, 11 Drawing Sheets

(56) References Cited

U.S. PATENT DOCUMENTS

| | | |
|---|---|---|
| 9,818,856 B2 | 11/2017 | Hoshi |
| 9,837,521 B2 | 12/2017 | Yamamoto |
| 11,043,584 B2 | 6/2021 | Chang |
| 11,557,669 B2 | 1/2023 | Chang |
| 11,810,872 B2 * | 11/2023 | Lee .................. H01L 29/41758 |
| 2005/0110054 A1 | 5/2005 | Wohlmuth |
| 2014/0094223 A1 | 4/2014 | Dasgupta |
| 2020/0219987 A1 * | 7/2020 | Lee .................... H01L 29/4236 |

* cited by examiner

SEMICONDUCTOR DEVICE

CROSS REFERENCE TO RELATED APPLICATIONS

This application is a continuation application of U.S. application Ser. No. 18/079,901, filed on Dec. 13, 2022, which is a continuation application of U.S. application Ser. No. 17/321,534, filed on May 17, 2021, which is a continuation application of U.S. application Ser. No. 16/655,252, filed on Oct. 17, 2019. The contents of these applications are incorporated herein by reference.

BACKGROUND OF THE INVENTION

1. Field of the Invention

The present disclosure relates to the field of high electron mobility transistors, and more particularly to an enhancement mode high electron mobility transistor.

2. Description of the Prior Art

In semiconductor technology, group III-V semiconductor compounds may be used to form various integrated circuit (IC) devices, such as high power field-effect transistors (FETs), high frequency transistors, or high electron mobility transistors (HEMTs). A HEMT is a field effect transistor having a two dimensional electron gas (2-DEG) layer close to a junction between two materials with different band gaps (i.e., a heterojunction). The 2-DEG layer is used as the transistor channel instead of a doped region, as is generally the case for metal oxide semiconductor field effect transistors (MOSFETs). Compared with MOSFETs, HEMTs have a number of attractive properties such as high electron mobility and the ability to transmit signals at high frequencies. In the processes for fabricating the conventional HEMTs, however, multiple photolithographic and etching processes are required to define the source/drain regions of the HEMTs and the isolation region between two adjacent HEMTs, which increases the complexity of the overall process. In addition, the isolation region between two adjacent HEMTs is often more recessed than the regions surrounding the isolation region, which also affects the flatness of the interconnection in the isolation region. Therefore, there is a need to improve the above drawbacks.

SUMMARY OF THE INVENTION

In view of this, it is necessary to provide an improved high electron mobility transistor without the drawbacks of the conventional high electron mobility transistors.

According to one embodiment of the present disclosure, a semiconductor device is disclosed and includes an enhancement mode high electron mobility transistor with an active region and an isolation region. The HEMT includes a substrate, a group III-V body layer, a group III-V barrier layer and a recess. The group III-V body layer is disposed on the substrate. The group III-V barrier layer is disposed on the group III-V body layer in the active region and the isolation region. The recess is disposed in the group III-V barrier layer without penetrating the group III-V barrier layer in the active region.

According to another embodiment of the present disclosure, a method of fabricating a semiconductor device including an active region and an isolation region is disclosed. The method includes the steps of: providing a substrate having a group III-V body layer and a group III-V barrier layer thereon; forming a first recess and a second recess in the group III-V barrier layer, where the first recess and the second recess are in the active region and the isolation region respectively; and depositing a passivation layer at bottoms of the first recess and the second recess, wherein portions of the group III-V barrier layer is disposed under the first recess and the second recess.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
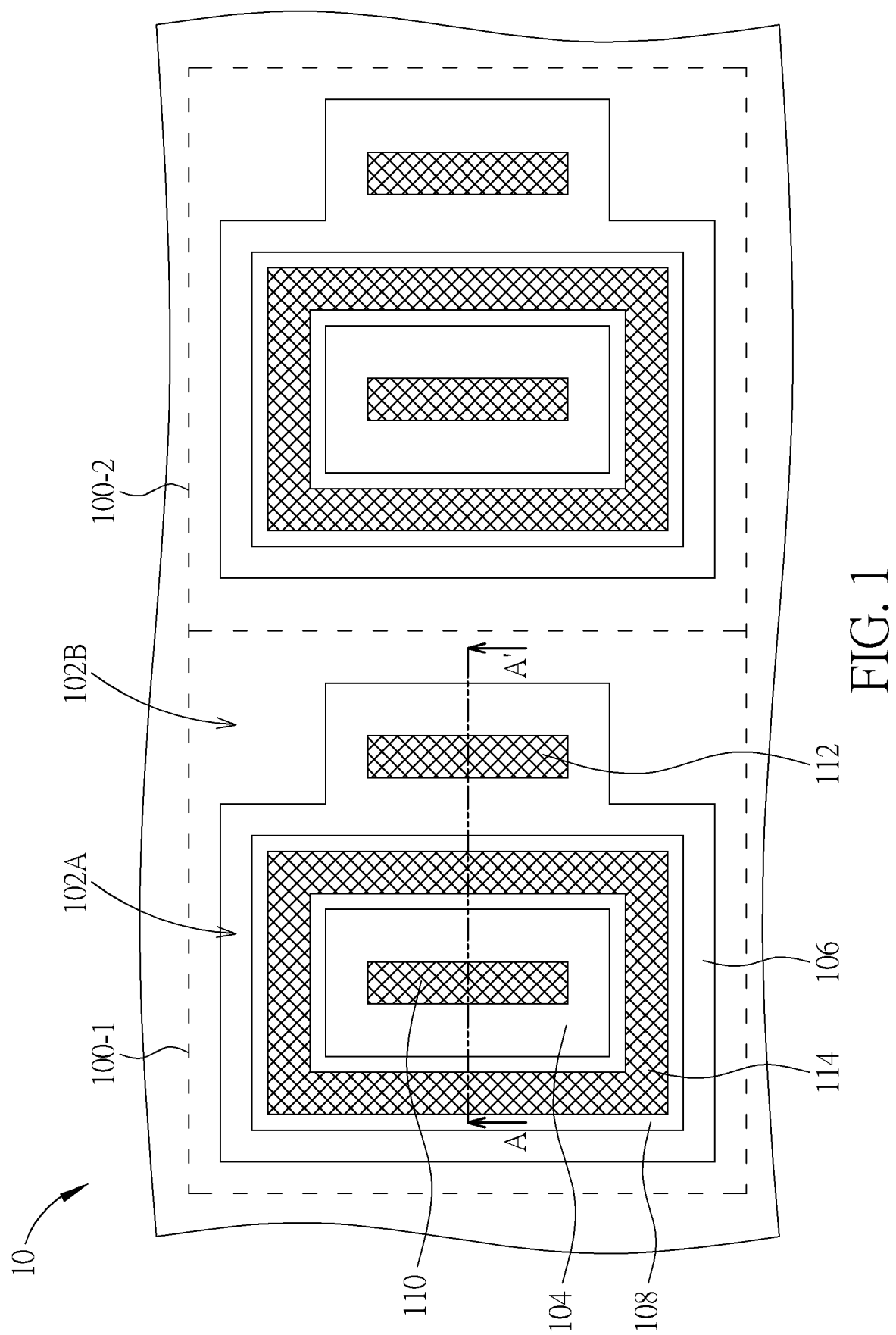
FIG. 1 is a top plan view of a semiconductor device in accordance with one embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the device, and certain elements in various drawings may not be drawn to scale. In addition, the number and dimension of each device shown in drawings are only illustrative and are not intended to limit the scope of the present disclosure.

Certain terms are used throughout the following description to refer to particular components. One of ordinary skill in the art would understand that electronic equipment manufacturers may use different technical terms to describe the same component. The present disclosure does not intend to distinguish between the components that differ only in name but not function. In the following description and claims, the terms "include", "comprise", and "have" are used in an open-ended fashion and thus should be interpreted as the meaning of "include, but not limited to".

The terminology used herein is for the purpose of describing particular embodiments only and is not intended to be limiting. The terms "comprises," "comprising," "includes" and/or "including" are inclusive and therefore specify the presence of stated features, integers, steps, operations, elements, and/or components, but do not preclude the presence or addition of one or more other features, integers, steps, operations, elements, components, and/or groups thereof.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

When an element or layer is referred to as being "coupled to" or "connected to" another element or layer, it may be directly coupled or connected to the other element or layer, or intervening elements or layers may be presented. In contrast, when an element is referred to as being "directly coupled to" or "directly connected to" another element or layer, there are no intervening elements or layers presented.

Further, spatially relative terms, such as "beneath," "below," "lower," "above," "upper" and the like, may be used herein for ease of description to describe one element or feature's relationship to another element(s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means in 10%, 5%, 1%, or 0.5% of a given value or range. Alternatively, the term "about" means in an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that may vary as desired. At the very least, each numerical parameter should at least be construed in light of the number of reported significant digits and by applying ordinary rounding techniques. Ranges may be expressed herein as from one endpoint to another endpoint or between two endpoints. All ranges disclosed herein are inclusive of the endpoints, unless specified otherwise.

It should be noted that the technical features in different embodiments described in the following may be replaced, recombined, or mixed with one another to constitute another embodiment without departing from the spirit of the present disclosure.

The present disclosure is directed to a group III-V high electron mobility transistor (HEMT) and method for fabricating the same. III-V HEMTs on silicon substrates are used as power switching transistors for voltage converter applications. Compared to silicon power transistors, III-V HEMTs feature low on-state resistances and low switching losses due to wide bandgap properties. In the present disclosure, a "group III-V semiconductor" refers to a compound semiconductor that includes at least one group III element and at least one group V element, where group III element may be boron (B), aluminum (Al), gallium (Ga) or indium (In), and group V element may be nitrogen (N), phosphorous (P), arsenic (As), or antimony (Sb). Furthermore, the group III-V semiconductor may refer to, but not limited to, gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN) and the like. In a similar manner, an "III-nitride semiconductor" refers to a compound semiconductor that includes nitrogen and at least one group III element, such as, but not limited to, GaN, aluminum nitride (AlN), indium nitride (InN), AlGaN, InGaN, InAlGaN and the like.

FIG. 1 is a top plan view of a semiconductor device in accordance with one embodiment of the present disclosure. Referring to FIG. 1, a semiconductor device 10 may include several high electron mobility transistors, such as a first high electron mobility transistor (HEMT) 100-1 and a second high electron mobility transistor 100-2. Each of the high electron mobility transistors may have the same configuration, and thus each of the high electron mobility transistors may be regarded as a repeating unit in the semiconductor device 10. Taking the first high electron mobility transistor 100-1 as an example, it may include an active region 102A and an isolation region 102B. Source/drain regions 104 and 106 and gate region 108 may be disposed in active region 102A and thus may be used to transmit current and/or turn on or off the current. The isolation region 102B is disposed around the active region 102A and may be used to avoid unnecessary electrical coupling between the adjacent two active regions 102A. In accordance with one embodiment of the present disclosure, the source/drain region 104 may be disposed at a center region of the active region 102A, such that the gate region 108 may surround the source/drain region 104 and the source/drain region 106 may surround the gate region 108. In addition, in order to reduce the contact resistance, low-resistance conductive electrodes, such as a source/drain electrode 110, a gate electrode 114, and a source/drain electrode 112 may be disposed on the surfaces of the source/drain region 104, the gate region 108, and the source/drain region 106, respectively. In accordance with one embodiment of the present disclosure, the gate electrode 114 may fully surround the source/drain region 104. However, the gate electrode 114 may be disposed on only one side or both sides of the source/drain region 104 according to another embodiment, but not limited thereto.

Figure 2:
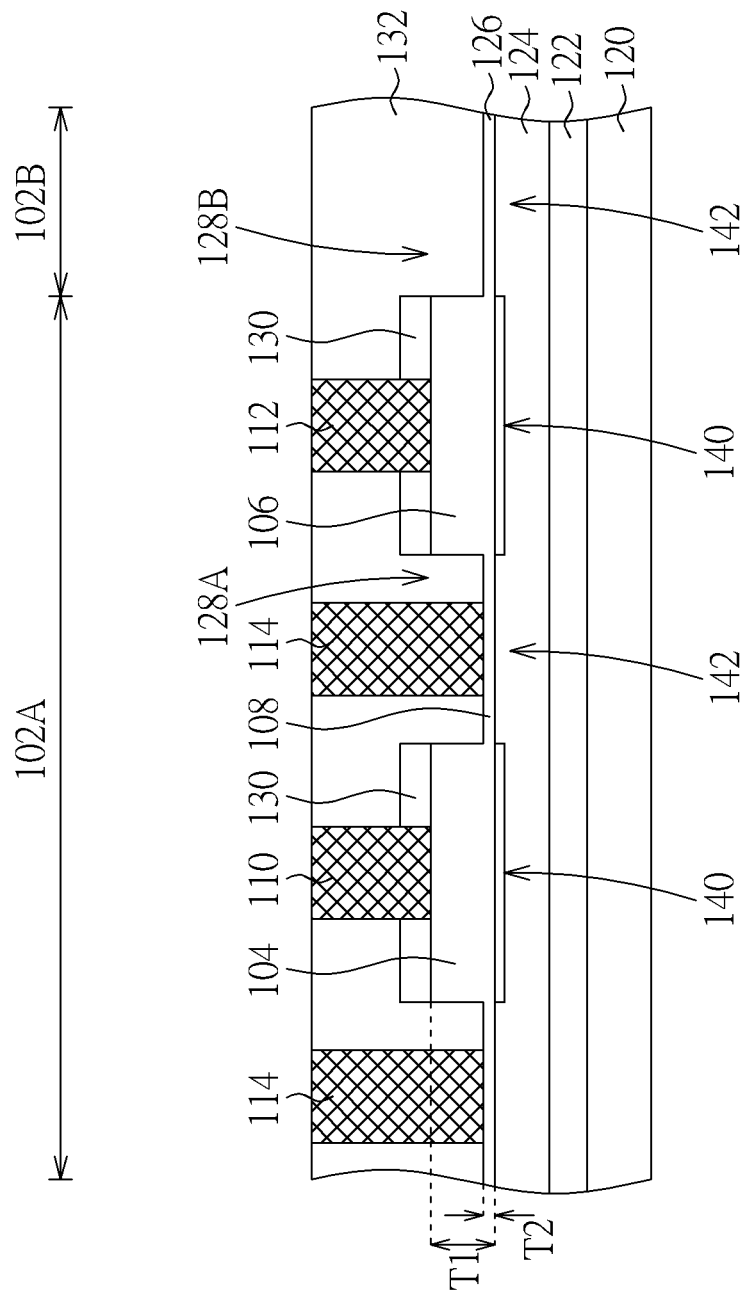
FIG. 2 is a cross-sectional view of a semiconductor device in accordance with one embodiment of the present disclosure.

FIG. 2 is a cross-sectional view of a semiconductor device taken along a line A-A' of FIG. 1 in accordance with one embodiment of the present disclosure. Referring to FIG. 1 and FIG. 2, the semiconductor device 10 includes at least a substrate 120, a group III-V body layer 124, a group III-V barrier layer 126, and a first recess 128A. The group III-V body layer 124 is disposed on the substrate 120, and the group III-V barrier layer 126 is disposed on the group III-V body layer 124 in the active region 102A and the isolation region 102B. The first recess 128A may be formed in the group III-V barrier layer 126 in the active region 102A. Specifically, the group III-V barrier layer 126 may be continuously distributed in the active region 102A or further continuously distributed in the active region 102A and the isolation region 102B. Portions of the III-V barrier layer 126 may have a thickness T1 greater than the thickness T2 of other portions of the III-V barrier layer 126. For example, the thickness T1 may be between 30-80 nm and the thickness T2 may be between 2-10 nm. By providing the group III-V barrier layer 126 with different thicknesses in predetermined regions, a 2-dimensional electron gas (2-DEG) may or may not be generated in the corresponding regions in the III-V body layer 124 under the group III-V barrier layer 126. In accordance with one embodiment of the present disclosure, the position of the group III-V barrier layer 126 with the thickness T1 may correspond to the positions of the source/drain regions 104 and 106. Thus, a 2-DEG region 140 may be generated in the corresponding III-V body layer 124 under the group III-V barrier layer 126 with the thickness T1. In contrast, the position of the group III-V barrier layer 126 with the thickness T2 may correspond to the position of the gate region 108 or the isolation region 102B. Thus, a 2-DEG cutoff region 142 may be generated in the corresponding III-V body layer 124 under the group III-V barrier layer 126 with the thickness T2. Since the resistance of the 2-DEG cutoff region 142 is much larger than the resistance of the 2-DEG region 140, the 2-DEG cutoff region 142 may be regarded as an electrical isolation region. According to the present disclosure, by providing the group III-V barrier layer 126 with different thicknesses, the 2-DEG may be formed only in specific regions, such as only in the source/drain regions 104 and 106.

In addition, a passivation layer 132 may be further disposed on the group III-V barrier layer 126 in order to reduce surface defects on the surface of the group III-V barrier layer 126. In accordance with one embodiment of the present disclosure, the passivation layer 132 may in direct contact the bottom of the first recess 128A, or even fill up the first recess 128A. Since the depth of the first recess 128A is not greater than 150 nm, the passivation layer 132 in the active region 102A may have a flat top surface. In this way, the interconnections formed on the passivation layer 132 during the following processes may be continuously distributed on the passivation layer 132 without breakage.

The group III-V body layer 124 may include one or more layers of group III-V semiconductor composed of GaN, AlGaN, InGaN, or InAlGaN, but not limited thereto. In addition, the group III-V body layer 124 may also be one or more layers of doped group III-V semiconductor, such as p-type III-V semiconductor. For the p-type group III-V semiconductor, the dopants of which may be C, Fe, Mg or Zn, but is not limited thereto. The group III-V barrier layer 126 may include one or more layers of group III-V semiconductor with the composition different from that of the group III-V semiconductor of the group III-V body layer 124. For example, the group III-V barrier layer 126 may include AlN, $Al_yGa_{(1-y)}N$ (0<y<1), or a combination thereof. In accordance with one embodiment, the group III-V body layer 124 may be an undoped GaN layer, and the group III-V barrier layer 126 may be an inherent n-type AlGaN layer. Since there is a bandgap discontinuity between the group III-V body layer 124 and the group III-V barrier layer 126, by stacking the group III-V body layer 124 and the group III-V barrier layer 126 on each other (and vice versa), a thin layer with high electron mobility, also called a two-dimensional electron gas, may be accumulated near the heterojunction between the group III-V body layer 124 and the group III-V barrier layer 126 due to the piezoelectric effect. The composition of the passivation layer 132 may include aluminum nitride, aluminum oxide or silicon nitride, but not limited thereto.

In accordance with one embodiment, an additional buffer layer 122 may be further disposed between the substrate 120 and the group III-V body layer 124. The purpose of the buffer layer 122 may be to reduce stress or lattice mismatch between the substrate 120 and the group III-V body layer 124.

In accordance with one embodiment of the present disclosure, an etch mask layer 130 may be further disposed between the group III-V barrier layer 126 and the passivation layer 132. During an etching process of patterning the III-V barrier layer 126, the etch mask layer 130 may cover portions of the group III-V barrier layer 126 in order to define the position of the first recess 128A. The composition of the etch mask layer 130 may include silicon nitride or silicon oxide. In accordance with one embodiment of the present disclosure, the etch mask layer 130 may further be used to define the location of another recess (also called a second recess 128B). Specifically, the first recess 128A and the second recess 128B are disposed in the group III-V barrier layer 126 and are in the active region 102A and the isolation region 102B, respectively. The etch mask layer 130 may be regarded as being spaced apart from the first recess 128A and the second recess 128B, or being spaced apart from the bottoms of the first recess 128A and the second recess 128B. In addition, portions of the group III-V barrier layer 126 are exposed from the bottoms of the first recess 128A and the second recess 128B. Thus, the passivation layer 132 may be filled into not only the first recess 128A in the active region 102A but also the second recess 128B in the isolation region 102B.

In accordance with one embodiment of the present disclosure, the source/drain electrodes 110 and 112 and the gate electrode 114 are all disposed in the active region 102A, and the bottom of the gate electrode 114 is disposed in the first recess 128A. The source/drain electrodes 110 and 112 and the gate electrode 114 may be in direct contact with the group III-V barrier layer 126 such that the source/drain electrodes 110 and 112 and the gate electrode 114 are all electrically coupled to the corresponding group III-V barrier layer 126. By properly biasing the source/drain electrodes 110 and 112, current may flow into or out of the source/drain regions 104 and 106. In addition, by properly biasing the gate electrode 114, the conductance of the carrier channel may be adjusted so that current may be able to flow between the source/drain regions 104 and 106.

The source/drain electrodes 110 and 112 and the gate electrode 114 may be single-layered or multi-layered structures, respectively, and the compositions thereof may include Al, Cu, W, Au, Pt, Ti, polysilicon, or other low resistance semiconductor, metal or alloy, but not limited thereto.

In order to enable one of ordinary skill in the art to implement the present disclosure, a method of fabricating a semiconductor device of the present disclosure is further described below.

Figure 3:
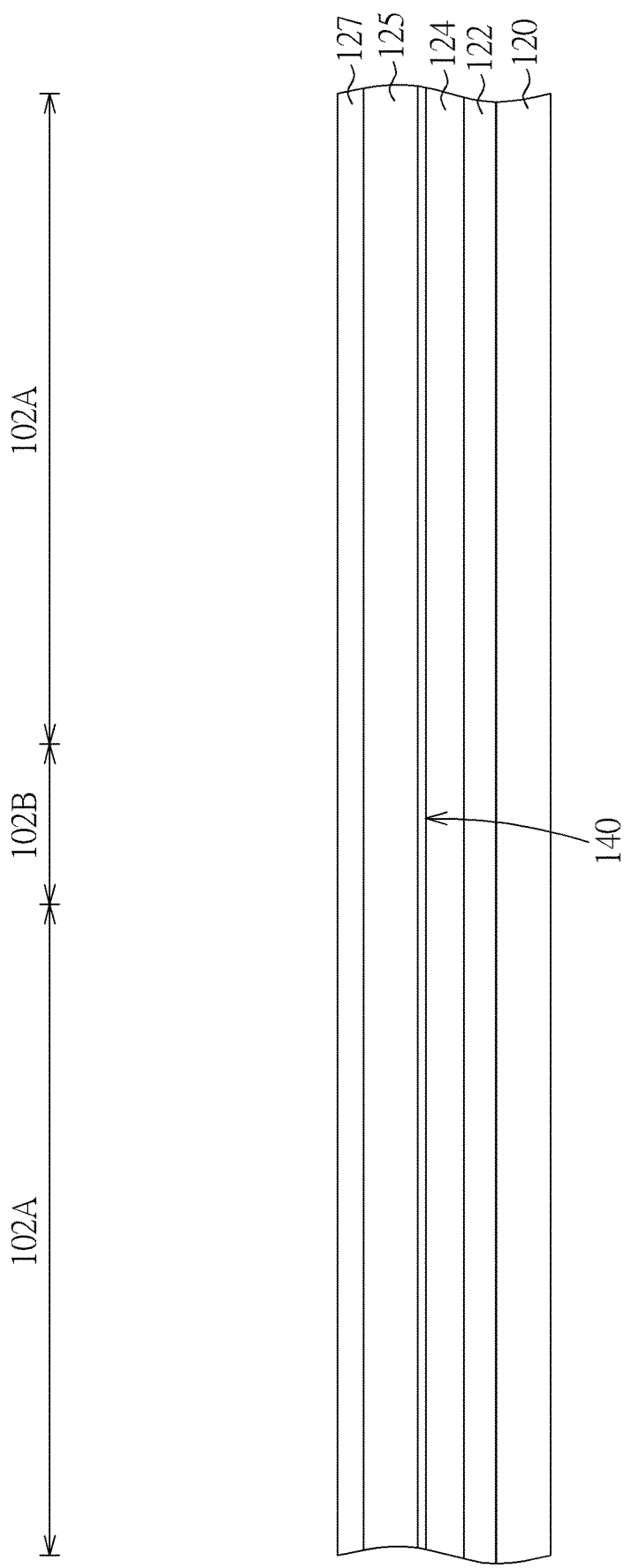
FIG. 3 is a cross-sectional view of a semiconductor device having a body layer, a barrier layer, and an etch mask layer disposed on a substrate in accordance with one embodiment of the present disclosure.

FIG. 3 is a schematic cross-sectional view of a semiconductor device where a body layer, a barrier layer, an etch mask layer are disposed on a substrate in accordance with one embodiment of the present disclosure. Referring to FIG. 3, the substrate 120 may be divided into the active regions 102A and the isolation region 102B disposed between the active regions 102A. The buffer layer 122, the group III-V body layer 124, the group III-V barrier layer 125, and the etch mask layer may be stacked on the substrate 120 in sequence. The substrate 120 may be a bulk silicon substrate, a silicon carbide (SiC) substrate, a sapphire substrate, a silicon on insulator (SOI) substrate or a germanium on insulator (GOI) substrate, but not limited thereto. The stacked layers on the substrate 120 may be formed through any suitable growth processes, such as molecular-beam epitaxy (MBE), metal-organic chemical vapor deposition (MOCVD), hydride vapor phase epitaxy (HVPE), atomic layer deposition (ALD) or other suitable growth processes. The buffer layer 122 may include a plurality of sub-semiconductor layers (i.e., multiple layers) and the overall resistance of the buffer layer 122 may be higher than the resistance of other layers on the substrate 120. Specifically, the ratio of some elements, such as metal element, of the buffer layer 122 may be changed gradually along a direction from the substrate 120 to the group III-V body layer 124. For example, for a case where the substrate 120 and the group III-V body layer 124 are a silicon substrate and a GaN layer, respectively, the buffer layer 122 may be graded aluminum gallium nitride ($Al_xGa_{(1-x)}N$) where there is a continuous or stepwise decrease in the x ratio from 0.9 to 0.15 along the direction from the substrate 120 to the group III-V body layer 124. In another case, the buffer layer 122 may have a superlattice structure. Since there is a bandgap discontinuity between the group III-V body layer 124 and the group III-V barrier layer 126, the 2-DEG region 140 may be generated near the heterojunction between the group III-V body layer 124 and the group III-V barrier layer 125.

Figure 4:
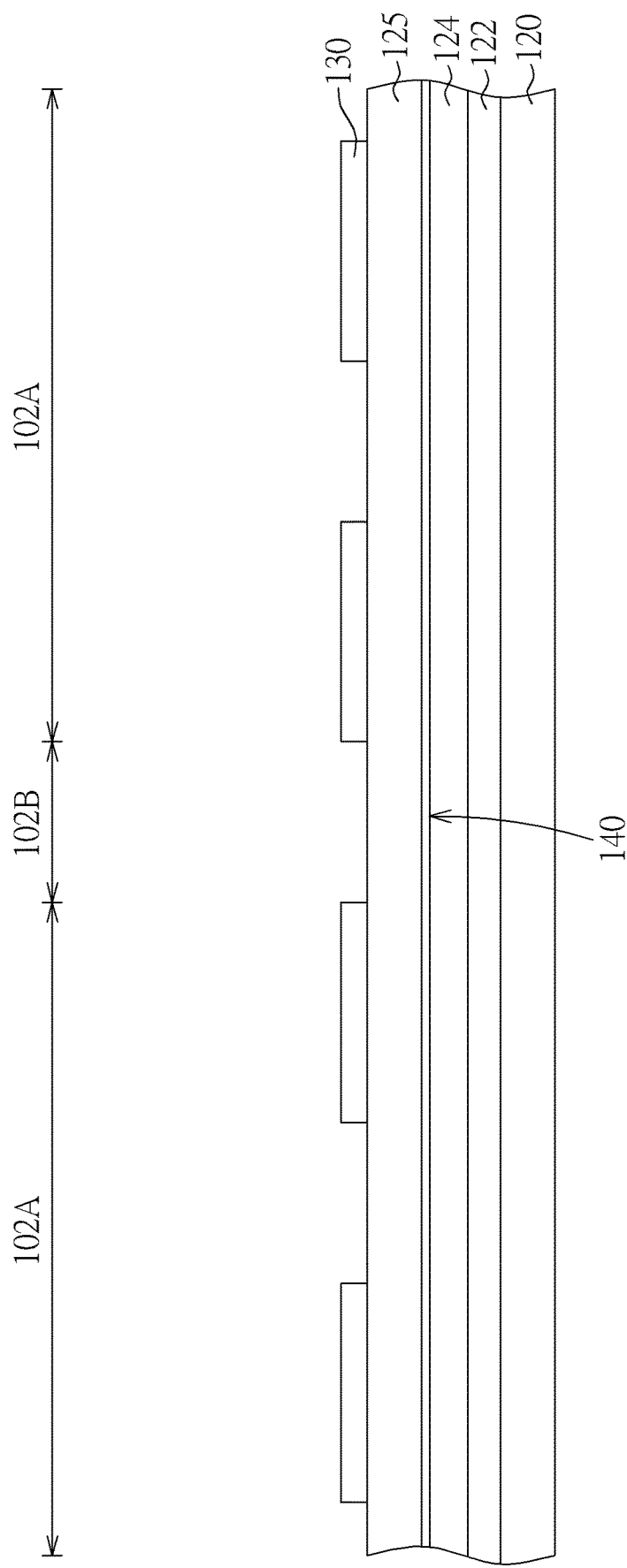
FIG. 4 is a cross-sectional view of a semiconductor device after an etch mask layer is patterned in accordance with one embodiment of the present disclosure.

FIG. 4 is a cross-sectional view of a semiconductor device after an etch mask layer is patterned in accordance with one embodiment of the present disclosure. After the process shown in FIG. 3, the etch mask layer 127 disposed on the group III-V barrier layer 125 may be further patterned by appropriate lithographic and etching processes so as to form a patterned etch mask layer 130. Since portions of the group III-V barrier layer 125 is not covered by the etch mask layer 130, at least portions of the group III-V barrier layer 125 not covered by the etch mask layer 130 may be etched in the subsequent etching process to thereby form recesses in the group III-V barrier layer 125.

Figure 5:
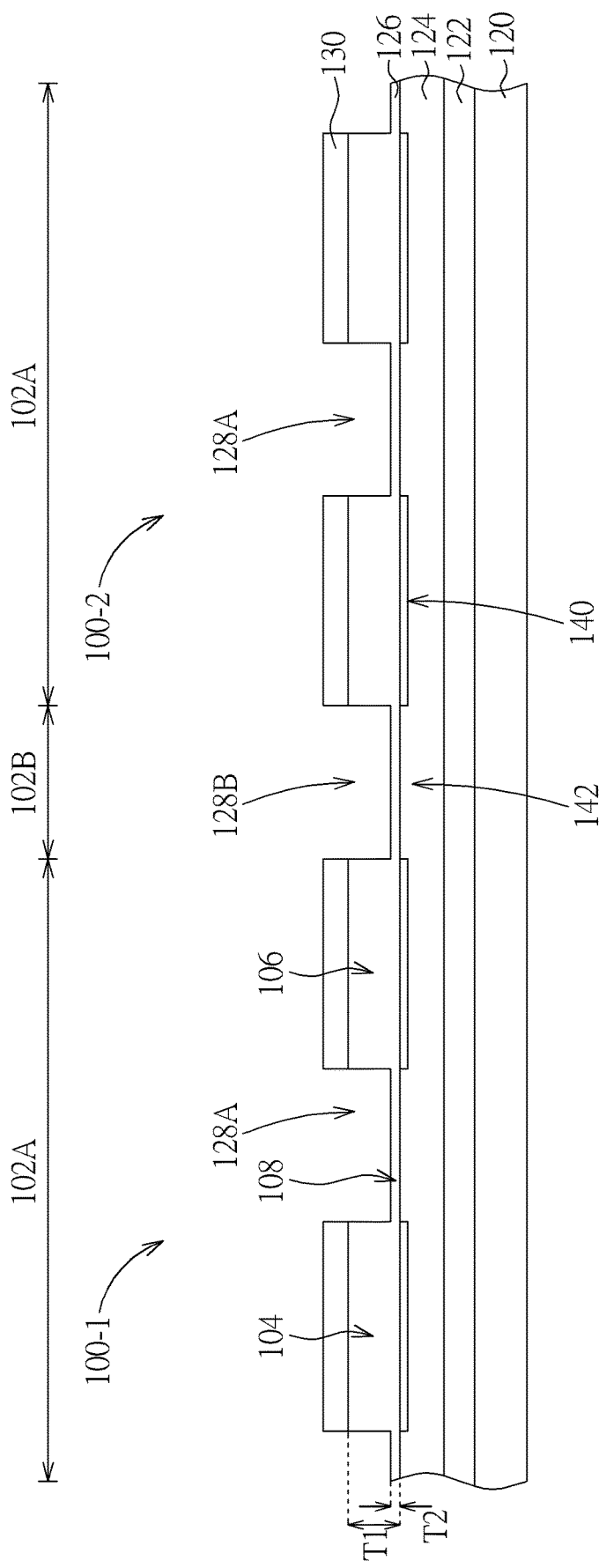
FIG. 5 is a cross-sectional view of a semiconductor device after a group III-V barrier layer is patterned in accordance with one embodiment of the present disclosure.

FIG. 5 is a cross-sectional view of a semiconductor device after a group III-V barrier layer is patterned in accordance with one embodiment of the present disclosure. After the process shown in FIG. 4, a suitable etching process may be carried out by using the etch mask layer 130 as an etch mask. A patterned III-V barrier layer 126 may be formed during the etching process in which the group III-V barrier layer 125 not covered by the etch mask layer 130 is etched. Thus, the first recess 128A and the second recess 128B may be formed in the active region 102A and the isolation region 102B concurrently, and the group III-V barrier layer 126 is exposed from the bottoms of the first recess 128A and the second recess 128B. In accordance with one embodiment of the present disclosure, the thickness T2 of the group III-V barrier layer 126 under the first recess 128A and the second recess 128B may be between 2-10 nm. According to another embodiment of the present disclosure, the group III-V barrier layer 126 under the first recess 128A and the second recess 128B may be etched away completely such that the group III-V body layer 124 is exposed from the bottoms of the first recess 128A and the second recess 128B. By forming the first recess 128A and the second recess 128B in the active region 102A and the isolation region 102B, respectively, the 2-DEG cutoff region 142 may be generated under the first recess 128A and the second recess 128B.

Figure 6:
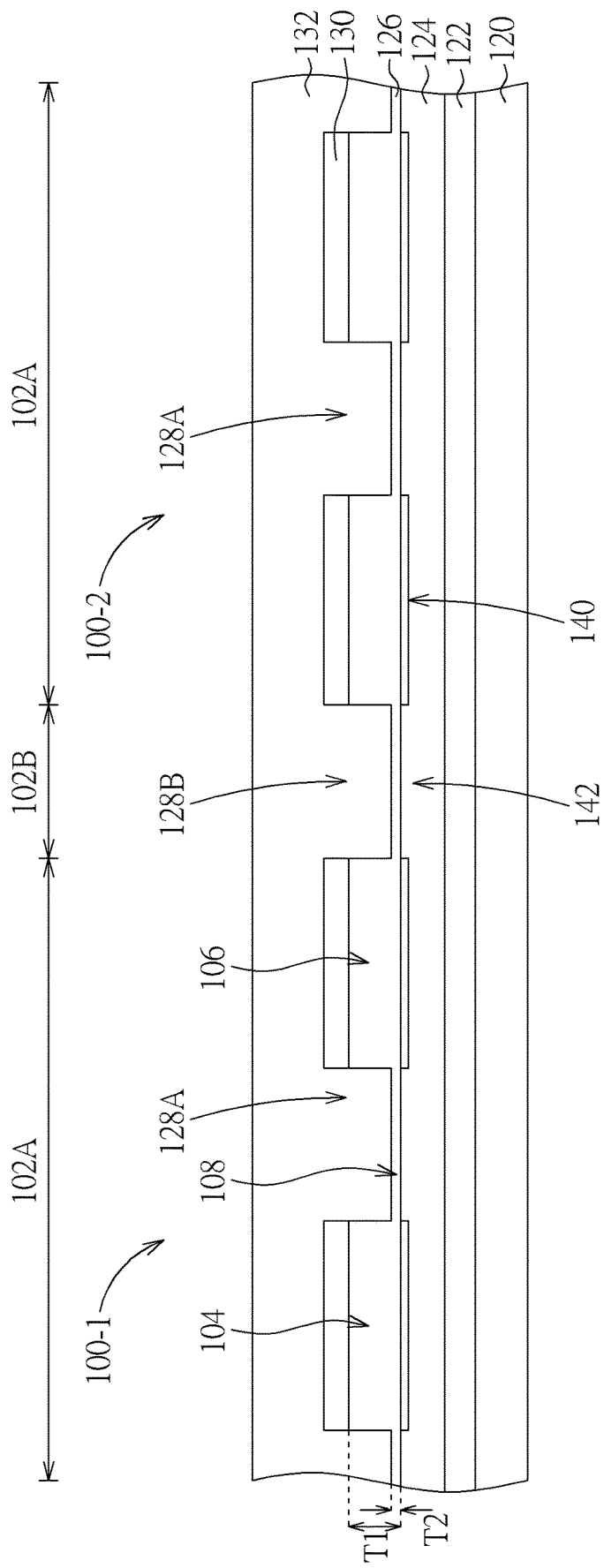
FIG. 6 is a cross-sectional view of a semiconductor device after a passivation layer is deposited in accordance with one embodiment of the present disclosure.

FIG. 6 is a cross-sectional view of a semiconductor device after a passivation layer is deposited in accordance with one embodiment of the present disclosure. After the process shown in FIG. 5, the passivation layer 132 may then be deposited comprehensively such that the passivation layer 132 may not only cover the group III-V barrier layer 126 and the etch mask layer 130 but also fill the first recess 128A and the second recess 128B. The composition of the passivation layer 132 includes, but not limited to, aluminum nitride, aluminum oxide or silicon nitride, which may be used to eliminate or reduce surface defects on the surface of the group III-V barrier layer 126. Therefore, the electron mobility in the 2-DEG region 140 may be increased.

Figure 7:
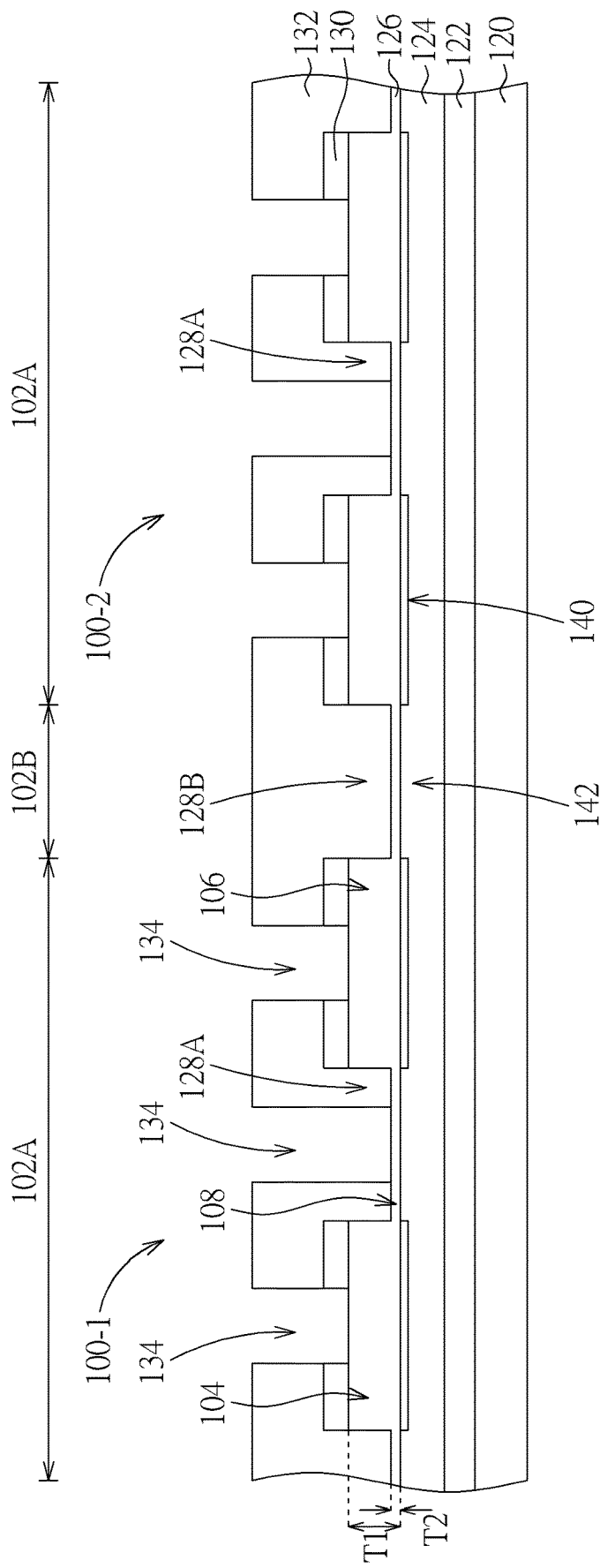
FIG. 7 is a cross-sectional view of a semiconductor device after contact hole are formed in a passivation layer in accordance with one embodiment of the present disclosure.

FIG. 7 is a cross-sectional view of a semiconductor device after contact holes are formed in a passivation layer in accordance with one embodiment of the present disclosure. After the process shown in FIG. 6, appropriate photolithographic and etching processes may then be carried out to form contact holes 134 in the passivation layer 132. In accordance with one embodiment of the present disclosure, the contact holes 134 are formed only in the active region 102A and are not in the isolation region 102B. In addition, some of the contact holes 134 may penetrate not only the passivation layer 132 but also the etch mask layer 130. Thus, portions of the group III-V barrier layer 126 may be exposed from the bottoms of the contact holes 134.

Figure 8:
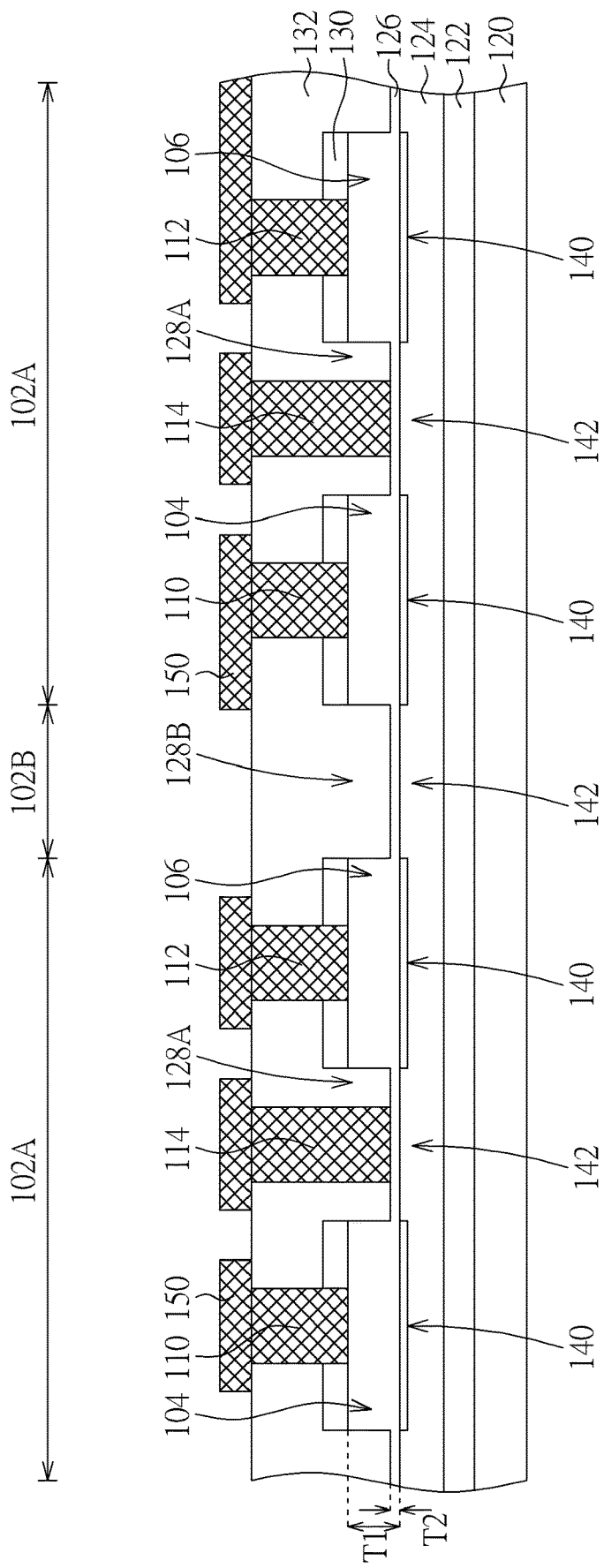
FIG. 8 is a cross-sectional view of a semiconductor device after a conductive structure is formed in a contact hole in accordance with one embodiment of the present disclosure.

FIG. 8 is a cross-sectional view of a semiconductor device after conductive structures are formed in contact holes in accordance with one embodiment of the present disclosure. After the process shown in FIG. 7, suitable deposition and etching processes may be carried out to form conductive structures filling the contact holes 134. The conductive structures may be source/drain electrodes 110 and 112 and gate electrode 114. The composition of the conductive structures may include titanium, aluminum or doped polysilicon, but not limited thereto. The source/drain electrodes 110 and the source/drain electrodes 112 may be electrically coupled to the source/drain region 104 and the source/drain regions 106 in the active region 102A, respectively, while the gate electrode 114 may be electrically coupled to the group III-V barrier layer 126 at the bottom of the first recess 128A. In accordance with one embodiment of the present disclosure, the source/drain electrodes 110, the source/drain electrodes 112, and the gate electrodes 114 are disposed only in the active region 102A and are not in the isolation region 102B. In other words, the source/drain electrodes 110, the source/drain electrodes 112, and the gate electrodes 114 may be spaced apart from the second recess 128B.

Still referring to FIG. 8, suitable deposition and etching processes may then be carried out to form several conductive interconnections 150 on the surface of the passivation layer 132. The interconnections 150 may be electrically coupled to the underlying source/drain electrodes 110, source/drain electrodes 112, and gate electrodes 114. Since the depths of the first recess 128A and the first recess 128B (the depth is the sum of the thickness of the etch mask layer 130 and the thickness T1 of the group III-V barrier layer 126) is not more than 150 nm, the passivation layer 132 in the active region 102A and the isolation region 102B may have a flat top surface such that the interconnections 150 formed over the passivation layer 132 may be continuously distributed without breakage. In addition, another interlayer dielectric or etch stop layer may be disposed between the passivation layer 132 and the interconnections 150, but not limited thereto.

According to the present disclosure, the semiconductor device 10 may include at least two enhancement mode high electron mobility transistors respectively disposed in the active regions 102A, and the two adjacent enhancement mode high electron mobility transistors may have a common isolation region 102B. The group III-V barrier layer 126 is a continuous layer disposed in the active region 102A and the isolation region 102B and is disposed between the two adjacent enhancement mode high electron mobility transistors. Since the first recess 128A and the second recess 128B respectively in the active region 102A and the isolation region 102B may be concurrently formed through the same photolithographic and etching process, the processes for fabricating the semiconductor device may be simplified. In other words, in accordance with one embodiment of the present invention, the active region 102A and the isolation region 102B may be defined by using the same reticle without using another reticle to define a mesa region. In addition, the depth of the isolation region 102B between the two adjacent high electron mobility transistors may not be too deep, such as less than 150 nm, so that the interconnections 150 in the isolation region 102B may have a better flatness.

Figure 9:
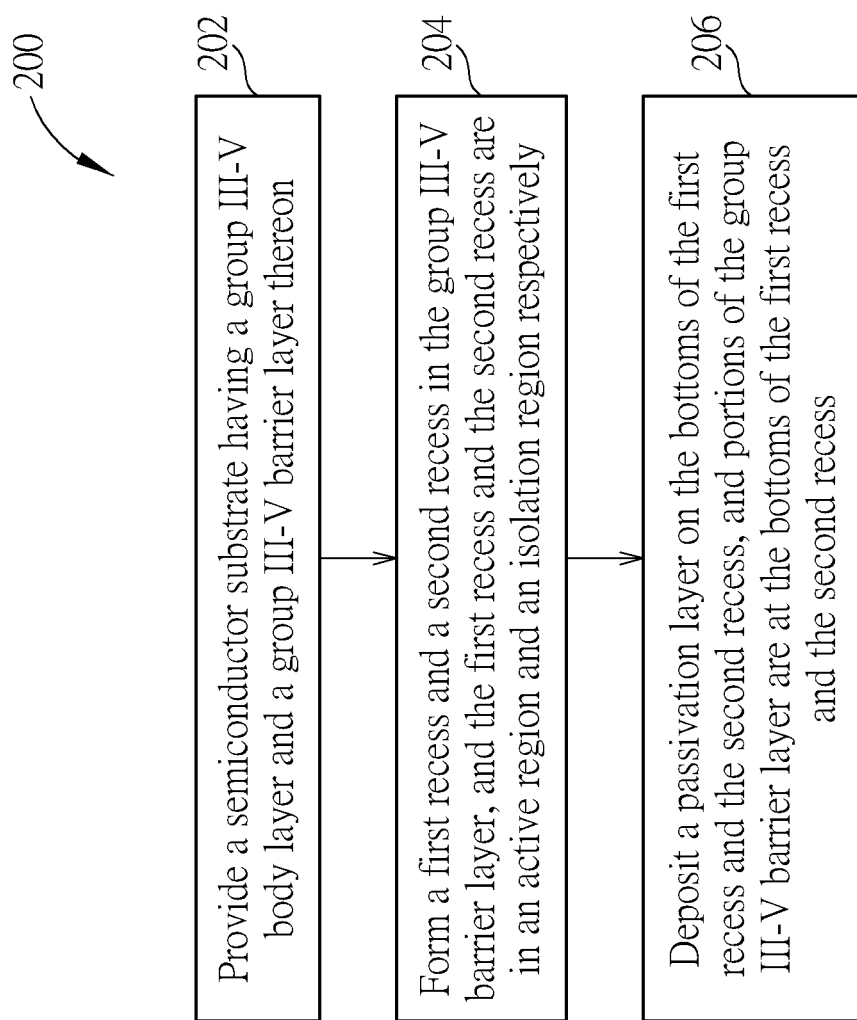
FIG. 9 is a flow chart of a method of fabricating a semiconductor device in accordance with one embodiment of the present disclosure.

FIG. 9 is a flow chart of a method of fabricating a semiconductor device in accordance with one embodiment of the present disclosure. In accordance with one embodiment of the present disclosure, a method 200 of fabricating a high electron mobility transistor may include: step 202: provide a semiconductor substrate having a group III-V body layer and a group III-V barrier layer thereon; step 204: form a first recess and a second recess in the group III-V barrier layer, and the first recess and the second recess are in an active region and an isolation region respectively; step 206: deposit a passivation layer on the bottoms of the first recess and the second recess, and portions of the group III-V barrier layer are at the bottoms of the first recess and the second recess.

Figure 10:
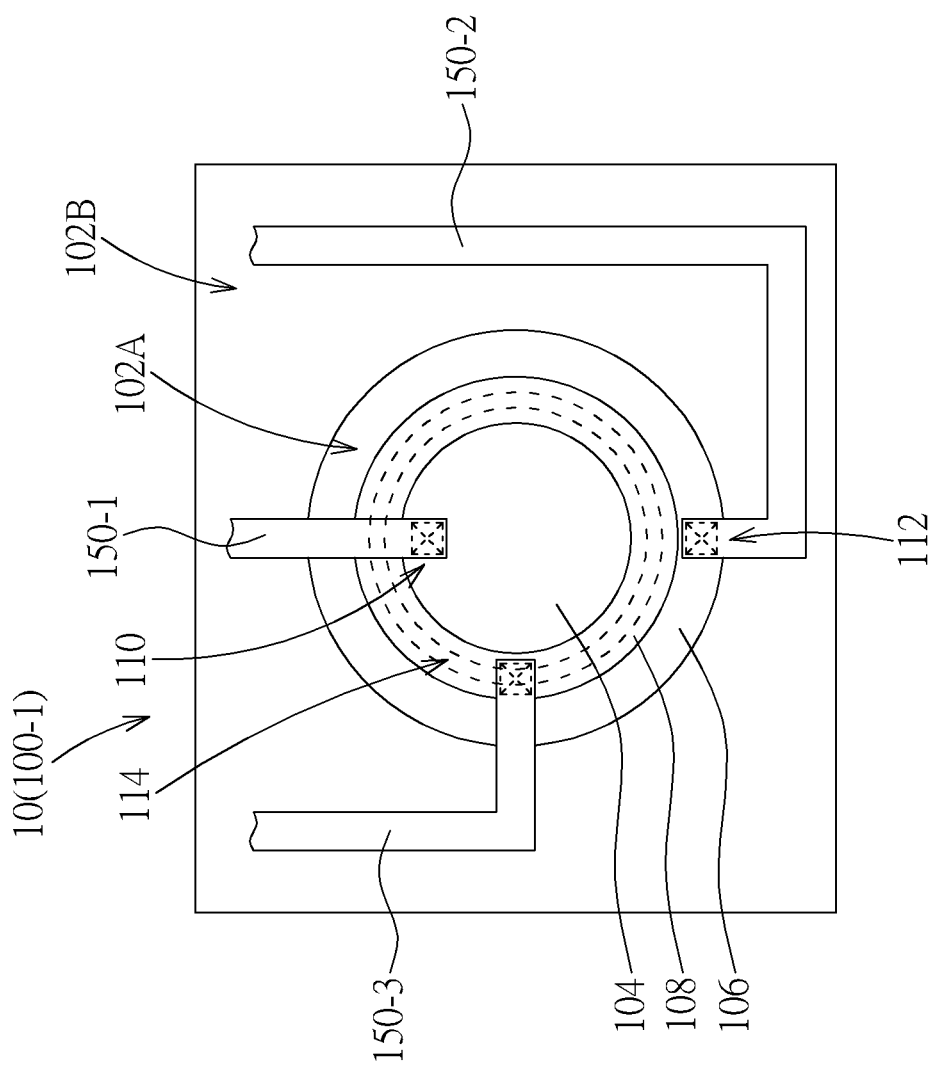
FIG. 10 is a top plan view of an enhancement mode high electron mobility transistor in accordance with one embodiment of the present disclosure.

FIG. 10 is a top plan view of an enhancement mode high electron mobility transistor in accordance with one embodiment of the present disclosure. The semiconductor device 10 shown in FIG. 10 is substantially similar to the semiconductor device 10 shown in FIG. 1, but the difference between the two is mainly in the design layout of the source/drain regions 104 and 106 and the gate region 108. Specifically, the semiconductor device 10 shown in FIG. 10 includes at least one high electron mobility transistor 100-1, and the source/drain region 104 is disposed in the middle region. The layout of the semiconductor device 10 may be a circular layout so that both the gate region 108 and the source/drain regions 106 may surround the source/drain region 104 in turn. Thus, current may flow between the source/drain region 104 and the source/drain region 106 by biasing the gate region 108. In addition, the conductive electrodes, such as the source/drain electrodes 110 and 112 and the gate electrodes 114, may be disposed on the surfaces of the source/drain regions 104 and 106 and the gate region 108, respectively. The area of the source/drain electrode 110 may be smaller than the area of the source/drain region 104, and the source/drain electrode 110 may be electrically coupled to the interconnection 150-1. The source/drain electrode 112 may have an area that is less than the area of the source/drain region 106 and may be electrically coupled to the interconnection 150-2. The gate electrode 114 may surround the source/drain region 104, and the gate electrode 114 may have an area smaller than the area of the gate region 108 and may be electrically coupled to the interconnection 150-3.

Figure 11:
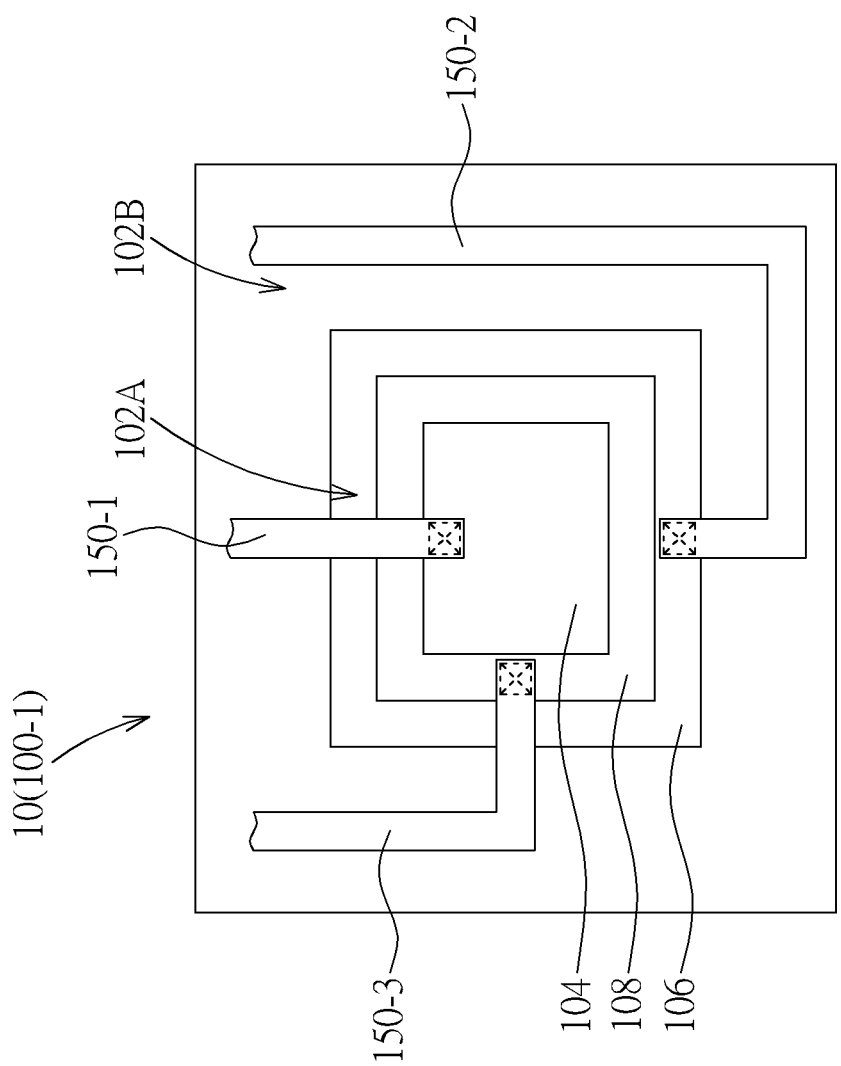
FIG. 11 is a top plan view of an enhancement mode high electron mobility transistor in accordance with another embodiment of the present disclosure.

FIG. 11 is a top plan view of an enhancement mode high electron mobility transistor in accordance with one embodiment of the present disclosure. The semiconductor device 10 shown in FIG. 11 is substantially similar to the semiconductor device 10 shown in FIG. 10, but the difference between the two is mainly in the design layout of the source/drain regions 104 and 106 and the gate region 108. Specifically, the source/drain region 104 of the semiconductor device 10 shown in FIG. 11 is disposed in the center region. The layout of the semiconductor device 10 may be a rectangular layout so that both the gate region 108 and source/drain regions 106 may surround the source/drain region 104 in turn. Besides, the gate region 108 and source/drain regions 106 may also have rectangular layouts. The semiconductor device 10 shown in FIG. 11 may also have the conductive electrodes and interconnections, and the configuration thereof is substantially similar to the configuration shown in FIG. 10, the description of which is omitted for the sake of brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
an enhancement mode high electron mobility transistor (HEMT) comprising an active region and an isolation region, wherein the enhancement mode HEMT comprises:
a substrate;
a group III-V body layer, disposed on the substrate;
a group III-V barrier layer, disposed on the group III-V body layer in the active region and the isolation region, wherein the group III-V barrier layer is a continuous layer in both the active region and the isolation region;
a recess, disposed in the group III-V barrier layer without penetrating the group III-V barrier layer in the active region; and
a gate electrode disposed in the recess, wherein the gate electrode is electrically coupled to and in direct contact with the group III-V barrier layer in the active region;
wherein the group III-V barrier layer is continuously distributed under an entirety of the gate electrode.

2. The semiconductor device of claim 1, wherein the group III-V barrier layer in the active region has a thickness between 2 and 10 nm.

3. The semiconductor device of claim 1, wherein the semiconductor device further comprises at least two source/drain electrodes disposed in the active region.

4. The semiconductor device of claim 1, further comprising an etch mask layer disposed on a top surface of the group III-V barrier layer and spaced apart from the recess.

5. The semiconductor device of claim 4, wherein a composition of the etch mask layer comprises silicon nitride or silicon oxide.

6. The semiconductor device of claim 1, wherein the semiconductor device further comprises another recess disposed in the group III-V barrier layer of the isolation region.

7. The semiconductor device of claim 6, wherein the group III-V barrier layer in the isolation region has a thickness between 2 and 10 nm.

8. The semiconductor device of claim 6, wherein the semiconductor device further comprises a passivation layer disposed in the recesses of the active region and the isolation region.

9. The semiconductor device of claim 8, further comprising an etch mask layer disposed between the passivation layer and the group III-V barrier layer in the active region, wherein the etch mask layer is spaced apart from bottoms of the recesses in the active region and the isolation region.

10. The semiconductor device of claim 8, wherein a composition of the passivation layer comprises aluminum nitride, aluminum oxide or silicon nitride.

11. The semiconductor device of claim 1, further comprising another enhancement mode high electron mobility transistor disposed on a side of the enhancement mode HEMT, wherein the group III-V barrier layer is a continuous layer disposed between the enhancement mode HEMTs.

12. A semiconductor device, comprising:
an enhancement mode high electron mobility transistor (HEMT) comprising an active region and an isolation region, wherein the enhancement mode HEMT comprises:
a substrate;
a group III-V body layer, disposed on the substrate;
a group III-V barrier layer, disposed on the group III-V body layer in the active region and the isolation region;
a first recess, disposed in the group III-V barrier layer in the active region; and
a second recess, disposed in the group III-V barrier layer without penetrating the group III-V barrier layer in the isolation region;
wherein the first recess and the second recess are laterally spaced apart from each other by a portion of the group III-V barrier layer.

* * * * *